(12) United States Patent
Hara et al.

(10) Patent No.: US 9,130,007 B2
(45) Date of Patent: Sep. 8, 2015

(54) SEMICONDUCTOR DEVICE

(71) Applicant: Kabushiki Kaisha Toshiba, Minato-ku, Tokyo (JP)

(72) Inventors: Takuma Hara, Kamakura (JP); Kazutoshi Nakamura, Himeji (JP); Tsuneo Ogura, Kamakura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/201,621

(22) Filed: Mar. 7, 2014

(65) Prior Publication Data
US 2015/0069460 A1    Mar. 12, 2015

(30) Foreign Application Priority Data
Sep. 6, 2013  (JP) ................. 2013-185612

(51) Int. Cl.
| H01L 29/66 | (2006.01) |
| H01L 29/739 | (2006.01) |
| H01L 29/10 | (2006.01) |

(52) U.S. Cl.
CPC ........ H01L 29/7395 (2013.01); H01L 29/1095 (2013.01); H01L 29/7397 (2013.01)

(58) Field of Classification Search
CPC ............ H01L 29/7395; H01L 29/7397; H01L 29/1095
USPC ........................................................ 257/139
See application file for complete search history.

(56) References Cited

U.S. PATENT DOCUMENTS

| 6,809,349 B2 | 10/2004 | Yamaguchi et al. |
| 6,891,224 B2 | 5/2005 | Ogura et al. |
| 7,211,837 B2 | 5/2007 | Tomomatsu et al. |
| 7,268,390 B2 | 9/2007 | Ogura et al. |
| 7,800,168 B2 | 9/2010 | Ogura et al. |
| 2005/0263853 A1 | 12/2005 | Tomomatsu et al. |

FOREIGN PATENT DOCUMENTS

| JP | 2001-127286 A | 5/2001 |
| JP | 2004-153112 A | 5/2004 |
| JP | 2010-232627 A | 10/2010 |
| JP | 4575713 B2 | 11/2010 |

*Primary Examiner* — Douglas Menz
(74) *Attorney, Agent, or Firm* — White & Case LLP

(57) ABSTRACT

In one embodiment, a semiconductor device includes a first semiconductor layer of a first conductivity type having first and second faces, and a second semiconductor layer of a second conductivity type disposed above the first face of the first semiconductor layer. The device further includes control electrodes facing the first and second semiconductor layers via insulating layers, and extending to a first direction parallel to the first face of the first semiconductor layer, and third semiconductor layers of the first conductivity type and fourth semiconductor layers of the second conductivity type alternately disposed along the first direction above the second semiconductor layer. The device further includes fifth semiconductor layers of the first conductivity type disposed below the second semiconductor layer or disposed at positions surrounded by the second semiconductor layer, the fifth semiconductor layers being arranged separately from one another along the first direction.

11 Claims, 6 Drawing Sheets

SEMICONDUCTOR DEVICE

CROSS REFERENCE TO RELATED APPLICATION

This application is based upon and claims the benefit of priority from the prior Japanese Patent Application No. 2013-185612, filed on Sep. 6, 2013, the entire contents of which are incorporated herein by reference.

FIELD

Embodiments described herein relate to a semiconductor device.

BACKGROUND

In a power transistor such as a trench-type insulated gate bipolar transistor (IGBT), a barrier layer is often formed below emitter layers and contact layers between trenches to improve the carrier injection enhancement effect (IE effect). However, the barrier layer has problems that holes cannot easily pass through the barrier layer, and that the barrier layer causes submerged resistance when the holes pass through the barrier layer. This results in an increase of loss at a turn-off of the power transistor and a decrease of latch-up strength of the power transistor.

DETAILED DESCRIPTION

Embodiments will now be explained with reference to the accompanying drawings.

In one embodiment, a semiconductor device includes a first semiconductor layer of a first conductivity type having a first face and a second face opposite to the first face, and a second semiconductor layer of a second conductivity type disposed above the first face of the first semiconductor layer. The device further includes control electrodes facing the first and second semiconductor layers via insulating layers, and extending to a first direction parallel to the first face of the first semiconductor layer, and third semiconductor layers of the first conductivity type and fourth semiconductor layers of the second conductivity type alternately disposed along the first direction above the second semiconductor layer. The device further includes fifth semiconductor layers of the first conductivity type disposed below the second semiconductor layer or disposed at positions surrounded by the second semiconductor layer, the fifth semiconductor layers being arranged separately from one another along the first direction.

First Embodiment

Figure 1A:
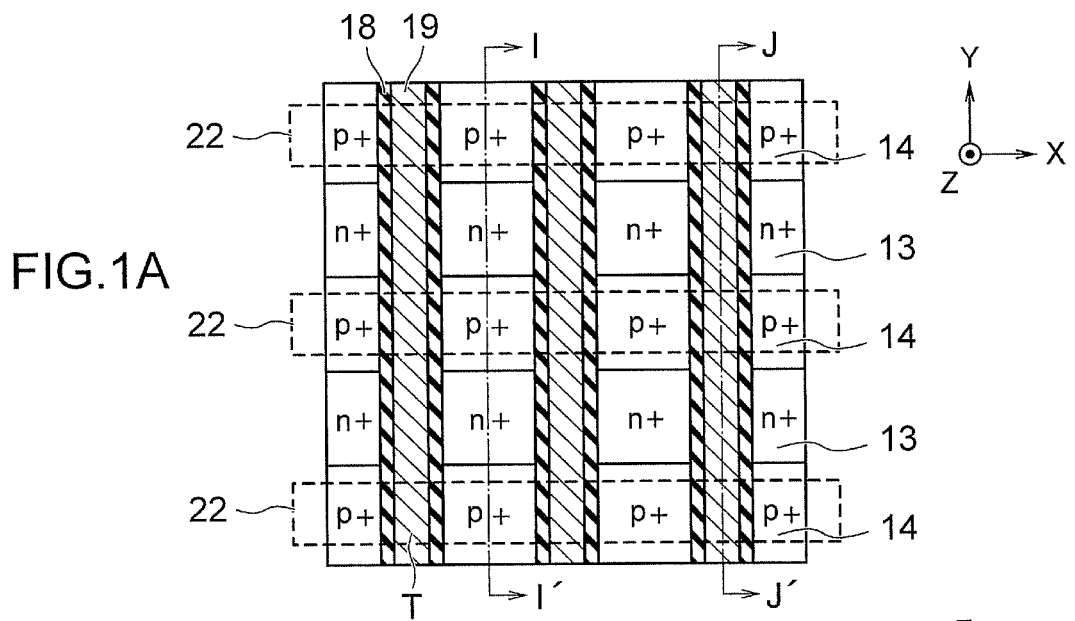
FIGS. 1A to 1C are a plan view and cross-sectional views illustrating a structure of a semiconductor device of a first embodiment.
Figure 1B:
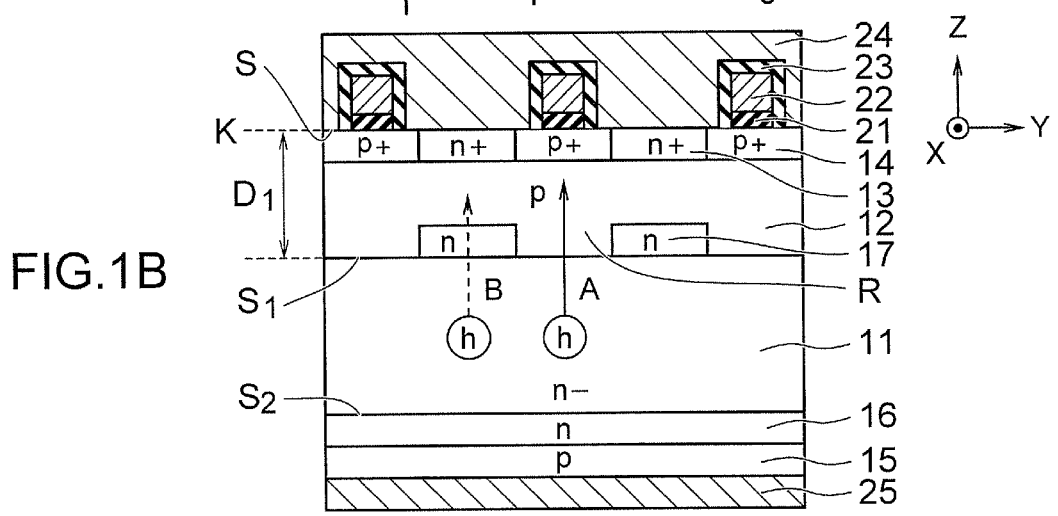
Figure 1C:
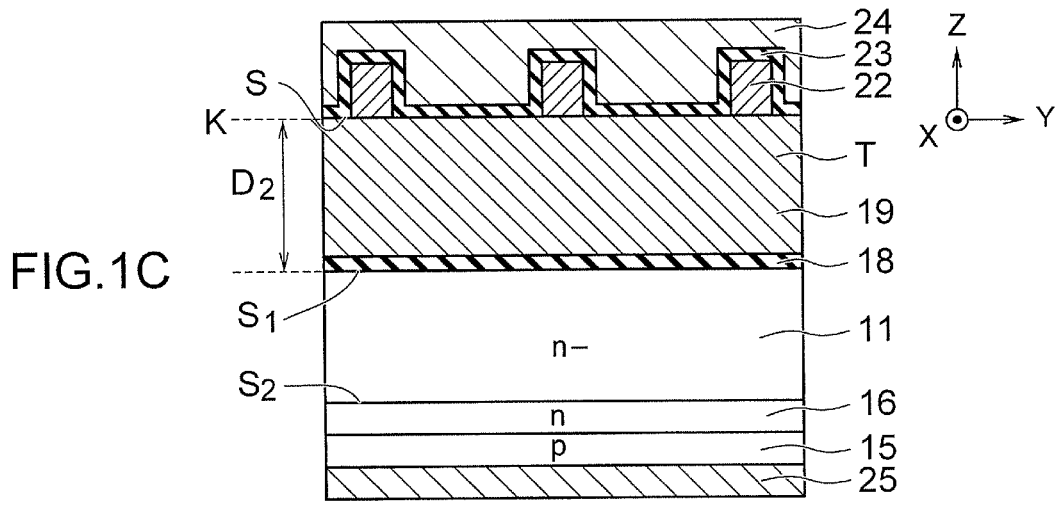
Figure 2A:
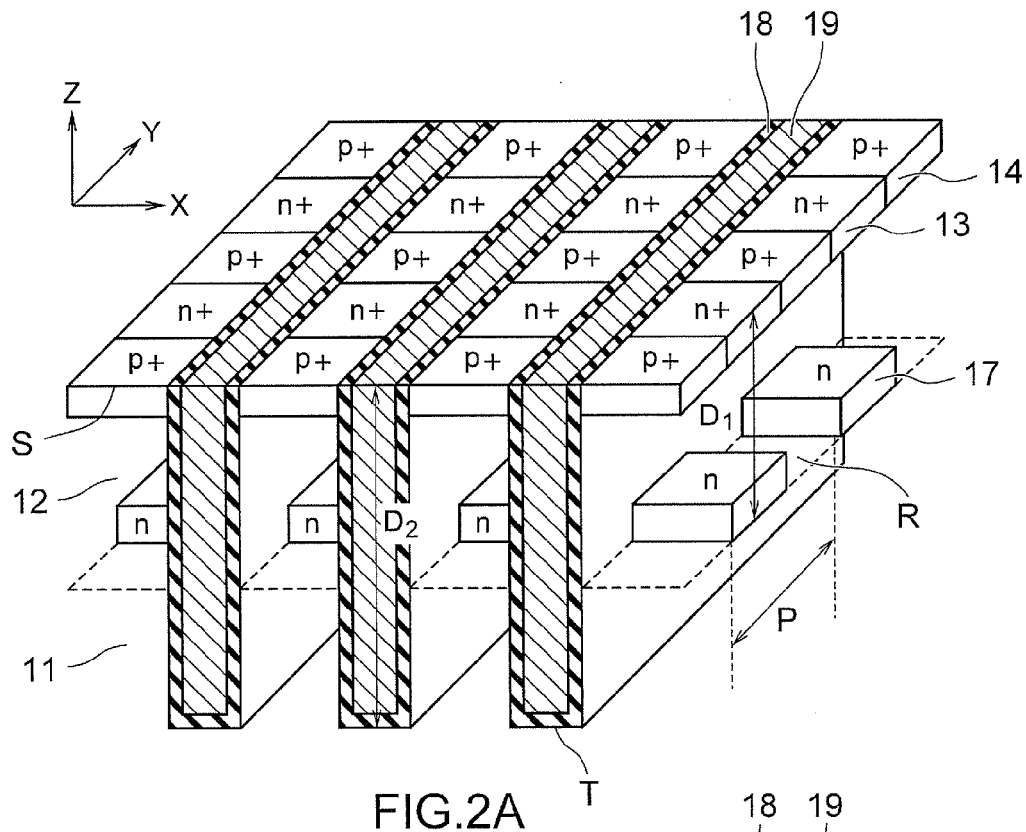
FIGS. 2A and 2B are perspective views illustrating structures of semiconductor devices of the first embodiment and a modification of the first embodiment.
Figure 2B:
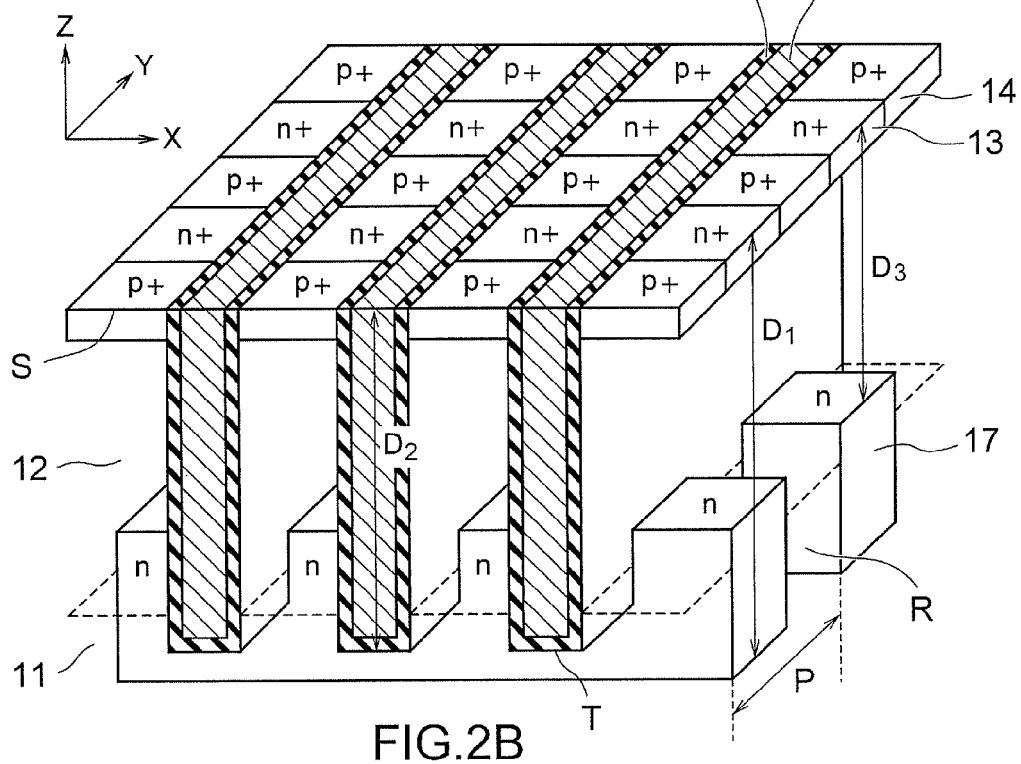

FIGS. 1A to 1C are a plan view and cross-sectional views illustrating a structure of a semiconductor device of a first embodiment. FIGS. 2A and 2B are perspective views illustrating structures of semiconductor devices of the first embodiment and a modification of the first embodiment. The semiconductor device of the present embodiment includes a trench-type IGBT as a power transistor.

FIG. 1A is the plan view illustrating the structure of the semiconductor device of the present embodiment. FIGS. 1B and 1C are the cross-sectional views along an I-I' line and a J-J' line illustrated in FIG. 1A, respectively. FIG. 1A shows the plan view along a plane K illustrated in FIGS. 1B and 1C.

FIG. 2A is the perspective view illustrating the structure of the semiconductor device of the present embodiment. FIG. 2B is the perspective view illustrating the structure of the semiconductor device of the modification of the present embodiment. FIGS. 2A and 2B only illustrate a part of the components illustrated in FIGS. 1A to 1C for convenience of description.

Hereinafter, the semiconductor device of the first embodiment will be described with reference to FIGS. 1A to 1C, and appropriately refers to FIGS. 2A and 2B in the description.

The semiconductor device of the present embodiment includes an n− type first base layer 11 as an example of a first semiconductor layer, a p type second base layer 12 as an example of a second semiconductor layer, n+ type emitter layers (source layers) 13 as an example of third semiconductor layers, p+ type contact layers 14 as an example of fourth semiconductor layers, a p type collector layer (drain layer) 15, an n type buffer layer 16, n type barrier layers 17 as an example of fifth semiconductor layers, a gate insulator 18 as an example of insulating layers, gate electrodes 19 as an example of control electrodes, insulating layers 21, gate interconnects 22, an insulating layer 23, an emitter electrode 24, and a collector electrode 25. In FIG. 2A, a boundary between the first base layer 11 and the second base layer 12 is indicated by a broken line.

In the present embodiment, first and second conductivity types are n type and p type, respectively. Instead, the first and second conductivity types may be p type and n type, respectively.

For example, the first base layer 11, the second base layer 12, the emitter layers 13, the contact layers 14, the collector layer 15, the buffer layer 16, and the barrier layers 17 are silicon layers.

The first base layer 11 has a first face $S_1$ and a second face $S_2$ opposite to the first face $S_1$. FIGS. 1A to 1C indicate an X direction and an Y direction parallel to the first and second faces $S_1$ and $S_2$ of the first base layer 11 and perpendicular to each other, and a Z direction perpendicular to the first and second faces $S_1$ and $S_2$ of the first base layer 11. The Y direction is an example of a first direction. The Z direction is an example of a second direction.

The second base layer 12 is formed on the first face $S_1$ of the first base layer 11. The reference sign T indicates trenches formed in the first and second base layers 11 and 12, and extending to the Y direction.

In the present specification, +Z direction is treated as an upward direction, and −Z direction is treated as a downward direction. For example, the positional relationship between the first and second faces $S_1$ and $S_2$ of the first base layer 11 is expressed such that the first face $S_1$ is positioned above the second face $S_2$.

The gate insulators 18 are formed on side faces and bottom faces of the trenches T. The gate insulators 18 are, for example, silicon oxide layers. The gate electrodes 19 are formed in the trenches T via the gate insulators 18, and extend to the Y direction. The gate electrodes 19 are, for example, polysilicon layers.

The emitter layers 13 and the contact layers 14 are formed on the second base layer 12 on an opposite side to the first base layer 11, and are alternately formed along the Y direction. The collector layer 15 is formed on the second face $S_2$ of the first base layer 11 via the buffer layer 16. Upper ends of the emitter layers 13 and the contact layers 14 of the present embodiment are set to be the same height as upper ends of the gate electrodes 19. The reference sign S indicates the upper ends of the emitter layers 13, the contact layers 14, and the gate electrodes 19.

The barrier layers 17 are formed on the second base layer 12 on a side of the first base layer 11. The barrier layers 17 are arranged separately from one another along the Y direction. The reference sign R indicates gaps between the barrier layers 17 adjacent to each other in the Y direction. The reference sign P (see FIG. 2A) indicates a pitch (cycle) between the barrier layers 17 adjacent to each other in the Y direction.

The barrier layers 17 are provided at positions overlapping with the emitter layers 13 when the semiconductor device is viewed parallel to the Z direction. The gaps R between the barrier layers 17 are provided at positions overlapping with the contact layers 14 when the semiconductor device is viewed parallel to the Z direction. The pitch P between the barrier layers 17 is set equal to a pitch between the emitter layers 13 adjacent to each other in the Y direction, and equal to a pitch between the contact layers 14 adjacent to each other in the Y direction.

The second base layer 12, the emitter layers 13, the contact layers 14, and the barrier layers 17 are arranged to come in contact with side faces of trenches T that sandwich these layers. In addition, the emitter layers 13 and the contact layers 14 are alternately arranged along the Y direction. Such a structure has an advantage that this structure is easily formed even if gaps between the trenches T are narrow, compared with a structure in which the emitter layers 13 and the contact layers 14 are adjacent to one another in the X direction.

As illustrated in FIG. 2A, a distance $D_1$ between the upper ends S of the gate electrodes 19 and the lower ends of the barrier layers 17 is set to be shorter than a distance $D_2$ between the upper ends S of the gate electrodes 19 and the lower ends of the trenches T ($D_1<D_2$). However, as illustrated in FIG. 2B, if a distance $D_3$ between the upper ends S of the gate electrodes 19 and the upper ends of the barrier layers 17 is shorter than the distance $D_2$ between the upper ends S of the gate electrodes 19 and the lower ends of the trenches T ($D_3<D_2$), the distance $D_1$ between the upper ends S of the gate electrodes 19 and the lower ends of the barrier layers 17 may be set to be longer than the distance $D_2$ between the upper ends S of the gate electrodes 19 and the lower ends of the trenches T ($D_1>D_2$). In other words, the entire barrier layers 17 may be sandwiched between the trenches T (between the gate electrodes 19), or only a part of the barrier layers 17 may be sandwiched between the trenches T (between the gate electrodes 19).

The gate interconnects 22 are formed on the upper ends S of the contact layers 14 and the gate electrodes 19 via the insulating layers 21, and extend to the X direction. For example, the insulating layers 21 are silicon oxide layers, and the gate interconnects 22 are polysilicon layers. The gate interconnects 22 are electrically connected to the gate electrodes 19.

The emitter electrode 24 is formed on the upper ends S of the emitter layers 13, the contact layers 14, and the gate electrodes 19 via the insulating layers 21, the gate interconnects 22, and the insulating layer 23. The emitter electrode 24 is electrically connected to the emitter layers 13 and the contact layers 14. The collector electrode 25 is formed on a lower face of the collector layer 15. The emitter electrode 24 is electrically connected to the collector layer 15.

(1) Impurity Concentration of Each Semiconductor Layer of First Embodiment

The impurity concentration of each semiconductor layer of the first embodiment will be described with reference to FIGS. 3 and 4.

Figure 3:
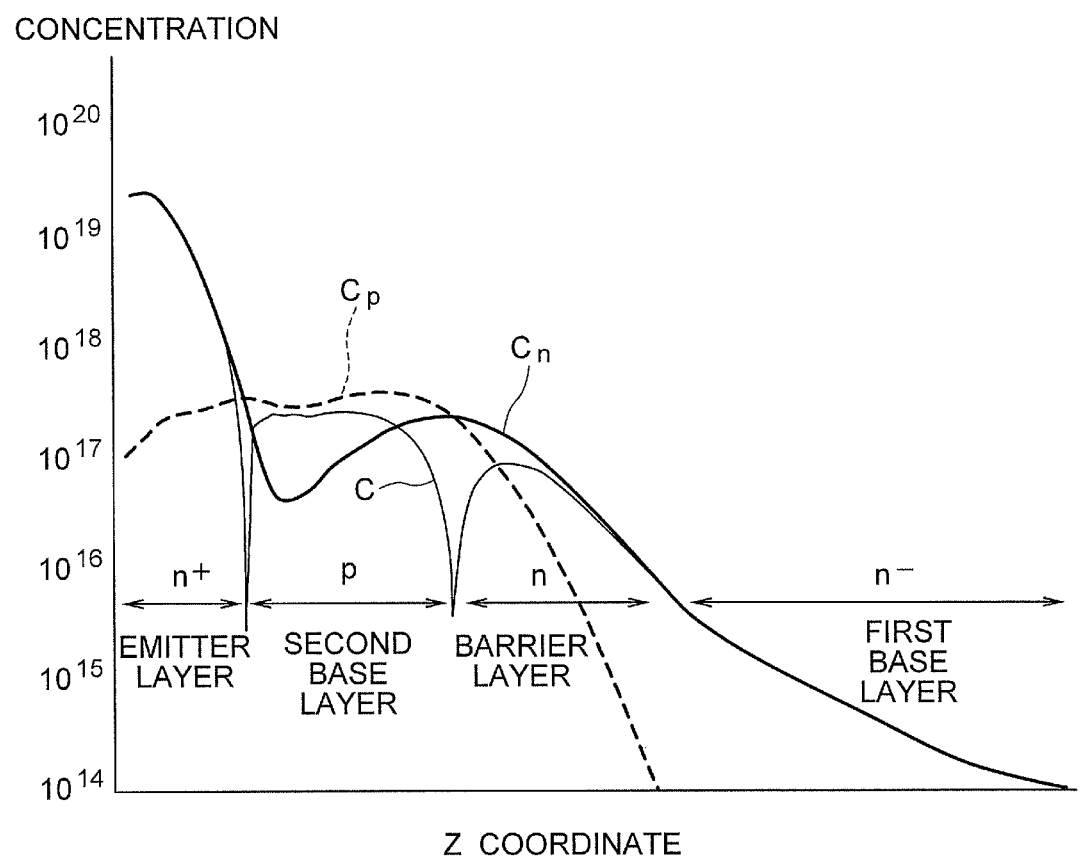
FIG. 3 is a diagram illustrating an example of Z-directional impurity concentration distribution of the semiconductor device of the first embodiment.

FIG. 3 is a diagram illustrating an example of Z-directional impurity concentration distribution of the semiconductor device of the first embodiment.

FIG. 3 illustrates the impurity concentration distribution on a straight line that is parallel to the Z direction and passes through an emitter layer 13, the second base layer 12, a barrier layer 17, and the first base layer 11. The unit of the impurity concentration of FIG. 3 is $1/cm^3$.

The reference signs $C_n$ and $C_p$ respectively indicate n type impurity concentration and p type impurity concentration of each layer. For example, the n type impurities are phosphorus, and the p type impurities are boron. The reference sign C indicates effective impurity concentration of each layer, which is obtained by offsetting the n type impurity concentration and the p type impurity concentration. Therefore, the relationship of $C=|C_n-C_p|$ is established between these impurity concentrations, where || expresses an absolute value.

In the present embodiment, as illustrated in FIG. 3, a peak value of the effective n type impurity concentration C in the barrier layer 17 is set to be lower than a peak value of the effective n type impurity concentration C in the emitter layer 13, and is set to be higher than a peak value of the effective n type impurity concentration C in the first base layer 11. The peak value of the effective n type impurity concentration C in the barrier layer 17 is set to be nearly equal to a peak value of an effective p type impurity concentration C in the second base layer 12.

In the present embodiment, as illustrated in FIG. 3, the peak value of the effective n type impurity concentration C in the barrier layer 17 is set to be $\frac{1}{10}$ or less of the peak value of the effective n type impurity concentration C in the emitter layer 13. Specifically, the peak value of the effective n type impurity concentration C in the barrier layer 17 is set to be about two digits lower compared to the peak value of the effective n type impurity concentration C in the emitter layer 13.

Figure 4:
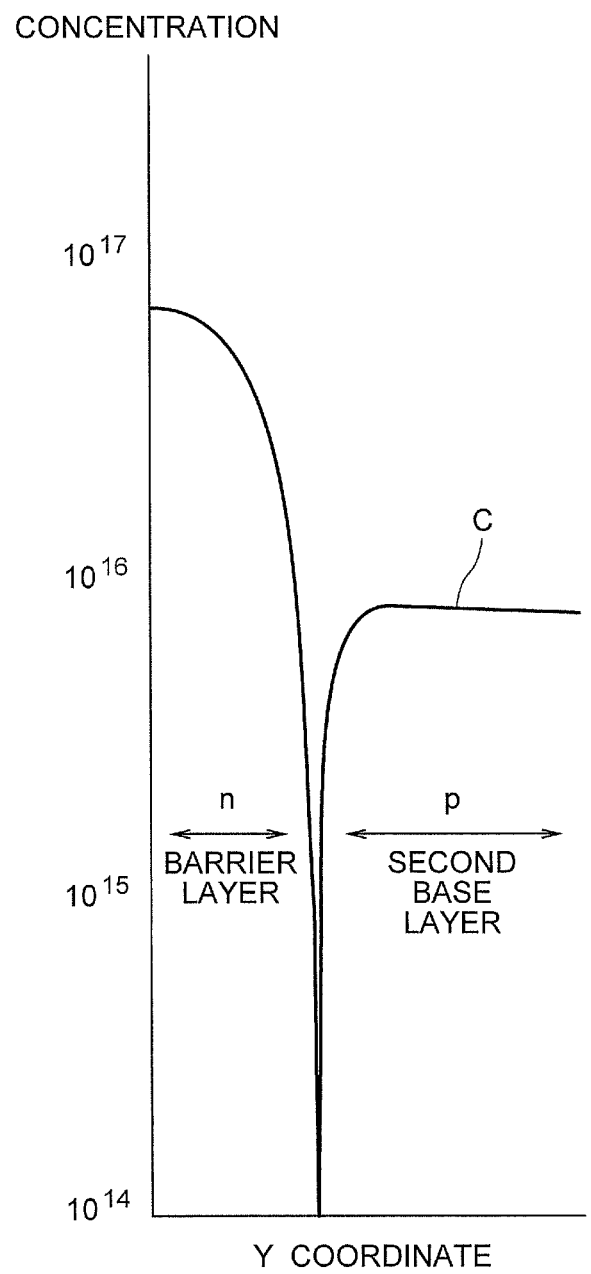
FIG. 4 is a diagram illustrating an example of Y-directional impurity concentration distribution of the semiconductor device of the first embodiment.

FIG. 4 is a diagram illustrating an example of Y-directional impurity concentration distribution of the semiconductor device of the first embodiment.

FIG. 4 illustrates the impurity concentration distribution on a straight line that is parallel to the Y direction and passes through a barrier layer 17 and the second base layer 12. The unit of the impurity concentration of FIG. 4 is $1/cm^3$. The reference sign C indicates effective impurity concentration of each layer.

Similarly to FIG. 3, FIG. 4 indicates the peak value of the effective n type impurity concentration C in the barrier layer 17 is set to be nearly equal to the peak value of the effective p type impurity concentration C in the second base layer 12.

As described above, the semiconductor device of the present embodiment includes the barrier layers 17 on the second base layer 12 on the side of the first base layer 11, and the barrier layers 17 are arranged separately from one another in the Y direction between the gate electrodes 19 adjacent to each other. Therefore, the gaps R are formed between the barrier layers 17 which are adjacent to each other in the Y direction.

Therefore, according to the present embodiment, holes in the first base layer 11 can pass through the gaps R as indicated by the arrow A, so that the holes can easily reach the contact layers 14 from the first base layer 11. Therefore, according to the present embodiment, it is possible to decrease the loss at a turn-off of the power transistor.

In addition, according to the present embodiment, the ratio of the holes in the first base layer 11 which pass through the barrier layers 17 as indicated by the arrow B can be decreased, so that the submerged resistance caused by the holes passing through the barrier layers 17 can be reduced. Therefore, according to the present embodiment, the latch-up due to parasitic resistance can be suppressed, so that the latch-up strength of the power transistor can be improved.

In this manner, according to the present embodiment, the loss at the turn-off of the power transistor can be decreased and the latch-up strength of the power transistor can be improved, while the improvement of the IE effect by the barrier layers 17 can be obtained.

In the present embodiment, the barrier layers 17 are provided at the positions overlapping with the emitter layers 13 in the Z direction, and the gaps R between the barrier layers 17 are set to the positions overlapping with the contact layers 14 in the Z direction.

Such arrangement of the present embodiment makes it possible to shorten a path of the holes which go from the first base layer 11 to the contact layers 14 via the gaps R, so that the holes can easily reach the contact layers 14.

Figure 5A:
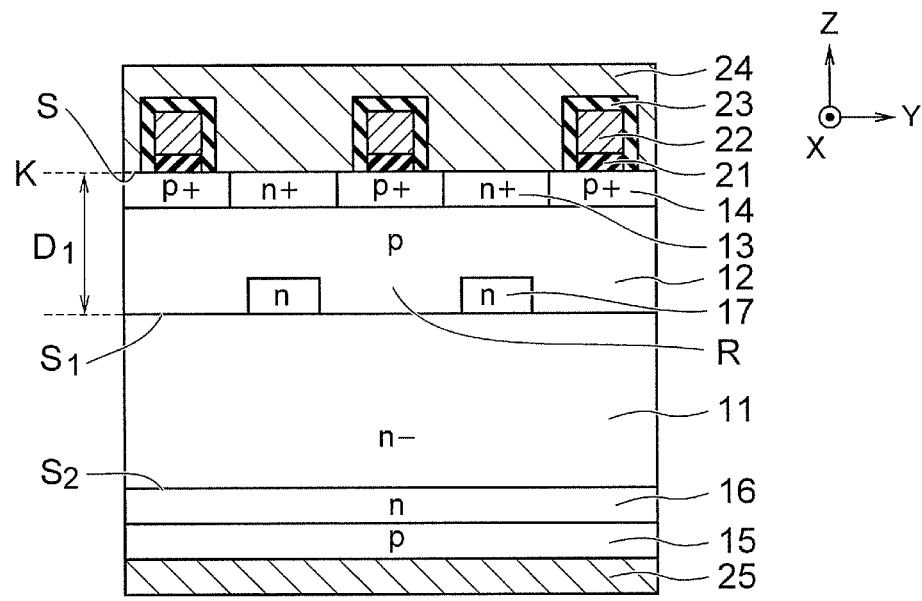
FIGS. 5A and 5B are cross-sectional views illustrating structures of semiconductor devices of modifications of the first embodiment.
Figure 5B:
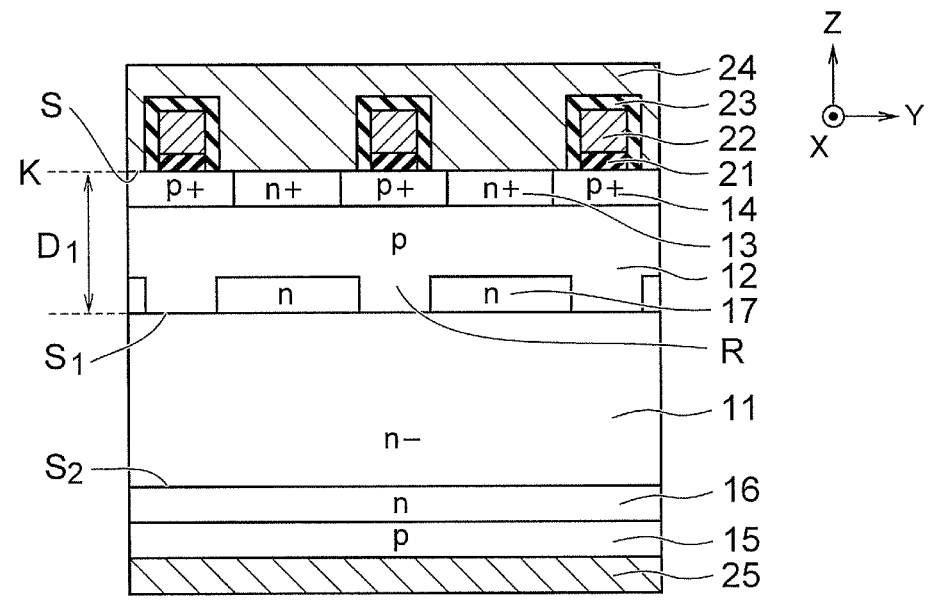

FIGS. 5A and 5B are cross-sectional views illustrating structures of semiconductor devices of modifications of the first embodiment.

The Y-directional width of the barrier layers 17 of FIG. 1B is set to be nearly equal to the Y-directional width of the emitter layers 13. However, the Y-directional width of the barrier layers 17 of the present embodiment may be shorter than the Y-directional width of the emitter layers 13 as illustrated in FIG. 5A, or may be longer than the Y-directional width of the emitter layers 13 as illustrated in FIG. 5B.

In other words, the barrier layers 17 may fully overlap with the emitter layers 13 in the Z direction as illustrated in FIG. 1B, or may be partially overlap with the emitter layers 13 in the Z direction as illustrated in FIGS. 5A and 5B.

Also, the gaps R between the barrier layers 17 may fully overlap with the contact layers 14 in the Z direction as illustrated in FIG. 1B, or may partially overlap with the contact layers 14 in the Z direction as illustrated in FIGS. 5A and 5B.

In FIG. 1B, the Y-directional width of the barrier layers 17 is set nearly equal to the Y-directional width of the emitter layers 13. Such a setting has an advantage that an impurity injection process for forming the barrier layers 17 and an impurity injection process for forming the emitter layers 13 can be performed by using the same resist mask.

As illustrated in FIGS. 1B, 5A and 5B, the barrier layers 17 of the present embodiment are formed on the second base layer 12 on the side of the first base layer 11. Therefore, the upper faces of the barrier layers 17 come in contact with the lower faces of the second base layer 12, and the lower faces of the barrier layers 17 come in contact with the first face $S_1$ of the first base layer 11. However, the barrier layers 17 may be formed at positions surrounded by the second base layer 12. In this case, the second base layer 12 of the present embodiment is not only in contact with the upper faces of the barrier layers 17, but also is sandwiched between the lower faces of the barrier layers 17 and the first face $S_1$ of the first base layer 11. The same applies to a second embodiment described below.

Second Embodiment

Figure 6:
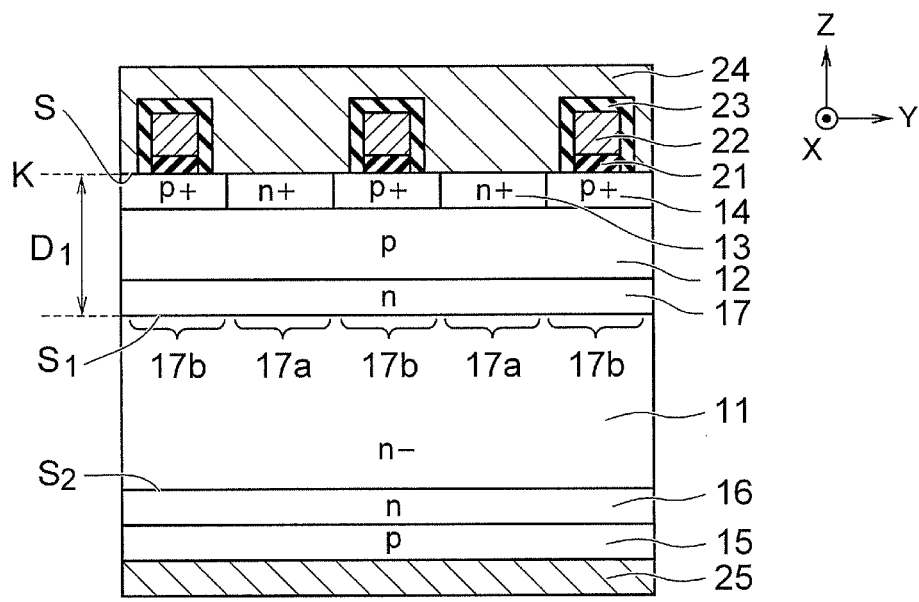
FIG. 6 is a cross-sectional view illustrating a structure of a semiconductor device of a second embodiment.

FIG. 6 is a cross-sectional view illustrating a structure of a semiconductor device of the second embodiment.

Similarly to FIG. 1B, FIG. 6 is the cross-sectional view along the I-I' line illustrated in FIG. 1A. Hereinafter, the semiconductor device of the second embodiment will be described, and the description of matters common to the first and second embodiments is omitted.

Similarly to the barrier layers 17 of the first embodiment, a barrier layer 17 of the present embodiment is formed on the second base layer 12 on the side of the first base layer 11.

However, the barrier layer 17 of the present embodiment extends to the Y direction between the gate electrodes 19 adjacent to each other. This structure is different from that of the barrier layers 17 of the first embodiment.

The reference sign 17a indicates first regions of the barrier layers 17. The first regions 17a are positioned directly under the emitter layers 13. The reference sign 17b indicates second regions of the barrier layer 17. The second regions 17b are positioned directly under the contact layers 14. Details of the first and second regions 17a and 17b will be described below.

For example, the barrier layer 17 of the present embodiment can be formed by forming of a plurality of n type layers between the first base layer 11 and the second base layer 12 by ion implantation, and then diffusing the n type impurities in the n type layers in a thermal process until the n type layers are bonded.

(1) Impurity Concentration of Barrier Layer 17 of Second Embodiment

The impurity concentration of the barrier layer 17 of the second embodiment will be described with reference to FIG. 7.

Figure 7:
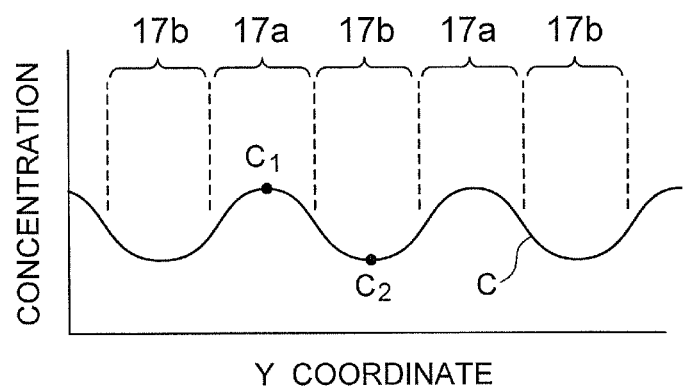
FIG. 7 is a diagram illustrating an example of Y-directional impurity concentration distribution of the semiconductor device of the second embodiment.

FIG. 7 is a diagram illustrating an example of Y-directional impurity concentration distribution of the semiconductor device of the second embodiment.

FIG. 7 illustrates the impurity concentration distribution on a straight line that is parallel to the Y direction and passes through the barrier layer 17. The unit of the impurity concentration of FIG. 7 is 1/cm³. The reference sign C indicates effective n type impurity concentration in the barrier layer 17.

As illustrated in FIG. 7, the barrier layer 17 of the present embodiment alternately includes maximum points $C_1$ of the effective n type impurity concentration C and minimum points $C_2$ of the effective n type impurity concentration C along the Y direction.

The maximum points $C_1$ are provided at positions overlapping with the emitter layers 13 when the semiconductor device is viewed parallel to the Z direction. In other words, the maximum points $C_1$ are provided in the first regions 17a of the barrier layer 17.

The minimum points $C_2$ are provided at positions overlapping with the contact layers 14 when the semiconductor device is viewed parallel to the Z direction. In other words, the minimum points $C_2$ are provided in the second regions 17b of the barrier layer 17.

In the present embodiment, the effective n type impurity concentration C of the maximum points $C_1$ is set to be lower than the peak value of the effective n type impurity concentration C in the emitter layers 13, and is set to be higher than the peak value of the effective n type impurity concentration C in the first base layer 11. Also, the effective n type impurity concentration C of the maximum points $C_1$ is set to be a value nearly equal to the peak value of the effective p type impurity concentration C in the second base layer 12.

Furthermore, the effective n type impurity concentration C of the minimum points $C_2$ is set to be 1/10 or less of the effective n type impurity concentration C of the maximum points $C_1$. Specifically, the effective n type impurity concentration C of the minimum points $C_2$ is set to be about two digits lower compared to the effective n type impurity concentration C of the maximum points $C_1$.

As described above, the semiconductor device of the present embodiment includes the barrier layer 17 formed on the second base layer 12 on the side of the first base layer 11, and extending to the Y direction. Also, the barrier layer 17 of the present embodiment alternately includes the maximum points $C_1$ and the minimum points $C_2$ of the effective n type impurity concentration C along the Y direction.

Therefore, according to the present embodiment, holes in the first base layer 11 can pass through regions near the minimum points $C_2$, so that the holes can easily reach the contact layers 14 from the first base layer 11. Therefore, according to the present embodiment, it is possible to decrease the loss at a turn-off of the power transistor, similarly to the first embodiment.

In addition, according to the present embodiment, the ratio of the holes in the first base layer 11 passing through regions near the maximum points $C_1$ can be decreased, so that the submerged resistance caused by the holes passing through the regions near the maximum points $C_1$ can be decreased. Therefore, according to the present embodiment, the latch-up due to parasitic resistance can be suppressed, so that the latch-up strength of the power transistor can be improved, similarly to the first embodiment.

In this manner, according to the present embodiment, the loss at the turn-off of the power transistor can be decreased and the latch-up strength of the power transistor can be improved, while the improvement of the IE effect by the barrier layer 17 can be obtained.

In the present embodiment, the maximum points $C_1$ are provided at the positions overlapping with the emitter layers 13 in the Z direction, and the minimum points $C_2$ are provided at the positions overlapping with the contact layers 14 in the Z direction.

Such an arrangement of the present embodiment makes it possible to shorten a path of the holes which go from the first base layer 11 to the contact layers 14 via the regions near the minimum points $C_2$, so that the holes can easily reach the contact layers 14.

While certain embodiments have been described, these embodiments have been presented by way of example only, and are not intended to limit the scope of the inventions. Indeed, the novel devices described herein may be embodied in a variety of other forms; furthermore, various omissions, substitutions and changes in the form of the devices described herein may be made without departing from the spirit of the inventions. The accompanying claims and their equivalents are intended to cover such forms or modifications as would fall within the scope and spirit of the inventions.

The invention claimed is:

1. A semiconductor device comprising:
   a first semiconductor layer of a first conductivity type having a first face and a second face opposite to the first face;
   a second semiconductor layer of a second conductivity type disposed above the first face of the first semiconductor layer;
   control electrodes facing the first and second semiconductor layers via insulating layers, and extending to a first direction parallel to the first face of the first semiconductor layer;
   third semiconductor layers of the first conductivity type and fourth semiconductor layers of the second conductivity type alternately disposed along the first direction above the second semiconductor layer; and
   fifth semiconductor layers of the first conductivity type disposed below the second semiconductor layer or disposed at positions surrounded by the second semiconductor layer, the fifth semiconductor layers being arranged separately from one another along the first direction.

2. The device of claim 1, wherein the fifth semiconductor layers are disposed at positions overlapping with the third semiconductor layers in a second direction perpendicular to the first face of the first semiconductor layer.

3. The device of claim 1, wherein gaps between the fifth semiconductor layers are disposed at positions overlapping with the fourth semiconductor layers in a second direction perpendicular to the first face of the first semiconductor layer.

4. The device of claim 1, wherein a peak value of effective impurity concentration of impurities of the first conductivity type in the fifth semiconductor layers is lower than a peak value of effective impurity concentration of impurities of the first conductivity type in the third semiconductor layers.

5. The device of claim 1, wherein a peak value of effective impurity concentration of impurities of the first conductivity type in the fifth semiconductor layers is higher than a peak value of effective impurity concentration of impurities of the first conductivity type in the first semiconductor layer.

6. The device of claim 1, wherein a pitch between the fifth semiconductor layers adjacent to each other in the first direction is the same as a pitch between the third semiconductor layers adjacent to each other in the first direction.

7. The device of claim 1, wherein a distance between upper ends of the control electrodes and lower ends of the fifth semiconductor layers is shorter than a distance between the upper ends of the control electrodes and lower ends of the insulating layers.

8. The device of claim 1, wherein a distance between upper ends of the control electrodes and lower ends of the fifth semiconductor layers is longer than a distance between the upper ends of the control electrodes and lower ends of the insulating layers.

9. The device of claim 8, wherein a distance between the upper ends of the control electrodes and upper ends of the fifth semiconductor layers is shorter than the distance between the upper ends of the control electrodes and the lower ends of the insulating layers.

10. The device of claim 1, wherein a width of the fifth semiconductor layers in the first direction is shorter than a width of the third semiconductor layers in the first direction.

11. The device of claim 1, wherein a width of the fifth semiconductor layers in the first direction is longer than a width of the third semiconductor layers in the first direction.

* * * * *